(12) United States Patent
Lee et al.

(10) Patent No.: US 11,581,257 B2
(45) Date of Patent: Feb. 14, 2023

(54) SEMICONDUCTOR PACKAGE

(71) Applicant: SAMSUNG ELECTRONICS CO., LTD., Suwon-si (KR)

(72) Inventors: Hyuek Jae Lee, Hwaseong-si (KR); Ji Hoon Kim, Asan-si (KR); Tae Hun Kim, Asan-si (KR); Ji Seok Hong, Yongin-si (KR); Ji Hwan Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 69 days.

(21) Appl. No.: 17/338,815

(22) Filed: Jun. 4, 2021

(65) Prior Publication Data

US 2021/0296228 A1    Sep. 23, 2021

Related U.S. Application Data

(63) Continuation of application No. 16/451,944, filed on Jun. 25, 2019, now Pat. No. 11,056,432.

(30) Foreign Application Priority Data

Oct. 24, 2018 (KR) .......................... 10-2018-0127736

(51) Int. Cl.
*H01L 23/528* (2006.01)
*H01L 23/31* (2006.01)
(Continued)

(52) U.S. Cl.
CPC ............ *H01L 23/528* (2013.01); *H01L 21/78* (2013.01); *H01L 23/3128* (2013.01);
(Continued)

(58) Field of Classification Search
CPC . H01L 2924/10155; H01L 2924/10156; H01L 21/78; H01L 2224/94;
(Continued)

(56) References Cited

U.S. PATENT DOCUMENTS 6,406,636 B1   6/2002 Vaganov
6,969,916 B2  11/2005 Shizuno
(Continued)

FOREIGN PATENT DOCUMENTS

EP   1895590 A1   3/2008
EP   2 479 806 A1   7/2012
(Continued)

OTHER PUBLICATIONS

Communication dated Apr. 3, 2020, from the European Patent Office in counterpart European Application No. 19204283.6.
(Continued)

*Primary Examiner* — Victoria K. Hall
(74) *Attorney, Agent, or Firm* — Sughrue Mion, PLLC

(57) ABSTRACT

A semiconductor package is provided. The semiconductor package includes a lower structure including an upper insulating layer and an upper pad; and a semiconductor chip provided on the lower structure and comprising a lower insulating layer and a lower pad. The lower insulating layer is in contact with and coupled to the upper insulating layer and the lower pad is in contact with and coupled to the upper pad, and a lateral side of the semiconductor chip extends between an upper side and a lower side of the semiconductor chip and comprises a recessed portion.

20 Claims, 13 Drawing Sheets

(51) Int. Cl.
   *H01L 23/367* (2006.01)
   *H01L 23/498* (2006.01)
   *H01L 23/00* (2006.01)
   *H01L 25/065* (2006.01)
   *H01L 21/78* (2006.01)

(52) U.S. Cl.
   CPC ...... *H01L 23/367* (2013.01); *H01L 23/49811* (2013.01); *H01L 23/49822* (2013.01); *H01L 23/49827* (2013.01); *H01L 24/08* (2013.01); *H01L 24/80* (2013.01); *H01L 25/0657* (2013.01); *H01L 24/05* (2013.01); *H01L 24/06* (2013.01); *H01L 2224/08145* (2013.01); *H01L 2224/08225* (2013.01); *H01L 2224/80091* (2013.01); *H01L 2224/80097* (2013.01); *H01L 2224/94* (2013.01); *H01L 2224/95001* (2013.01); *H01L 2224/95091* (2013.01); *H01L 2224/97* (2013.01); *H01L 2924/10156* (2013.01)

(58) Field of Classification Search
   CPC . H01L 2224/95001; H01L 2224/95091; H01L 2224/97; H01L 2924/10157; H01L 2924/10158
   USPC ......................................................... 257/620
   See application file for complete search history.

(56) References Cited

U.S. PATENT DOCUMENTS

| | | | |
|---|---|---|---|
| 7,091,062 B2 | 8/2006 | Geyer | |
| 9,029,199 B2* | 5/2015 | Sakurada | H01L 24/97 257/E23.021 |
| 9,343,498 B2* | 5/2016 | Saito | H01L 24/92 |
| 9,530,706 B2* | 12/2016 | Kang | H01L 25/0657 |
| 9,570,429 B2* | 2/2017 | Mao | H01L 24/96 |
| 9,653,430 B2 | 5/2017 | Kim et al. | |
| 9,780,136 B2* | 10/2017 | Kwon | H01L 27/1462 |
| 9,929,102 B1 | 3/2018 | Lee et al. | |
| 10,403,603 B2 | 9/2019 | Park et al. | |
| 10,748,875 B2 | 8/2020 | Ahn | |
| 10,872,836 B2 | 12/2020 | Yu et al. | |
| 11,031,285 B2* | 6/2021 | Katkar | H01L 21/76843 |
| 11,056,432 B2* | 7/2021 | Lee | H01L 23/49827 |
| 11,164,900 B2* | 11/2021 | Fan | H01L 27/1463 |
| 11,244,936 B2* | 2/2022 | Im | H01L 21/563 |
| 2003/0001281 A1 | 1/2003 | Kwon et al. | |
| 2004/0026768 A1 | 2/2004 | Taar et al. | |
| 2005/0136634 A1 | 6/2005 | Savastiouk et al. | |
| 2006/0175697 A1 | 8/2006 | Kurosawa et al. | |
| 2008/0128914 A1 | 6/2008 | Morita et al. | |
| 2008/0156518 A1 | 7/2008 | Honer. et al. | |
| 2008/0290525 A1 | 11/2008 | Anderson et al. | |
| 2008/0315407 A1 | 12/2008 | Andrews, Jr. et al. | |
| 2010/0233850 A1* | 9/2010 | Patti | H01L 24/05 438/107 |
| 2010/0258936 A1 | 10/2010 | Kim et al. | |
| 2011/0163458 A1 | 7/2011 | Tsukano | |
| 2013/0071970 A1 | 3/2013 | Fujimoto | |
| 2013/0119533 A1 | 5/2013 | Chen et al. | |
| 2013/0344658 A1 | 12/2013 | Sakurada | |
| 2014/0084454 A1 | 3/2014 | Arnold et al. | |
| 2015/0270304 A1* | 9/2015 | Saito | H01L 25/0657 438/109 |
| 2015/0279825 A1* | 10/2015 | Kang | H01L 25/0657 438/109 |
| 2015/0364376 A1 | 12/2015 | Yu et al. | |
| 2016/0155724 A1* | 6/2016 | Kim | H01L 21/6835 257/774 |
| 2016/0190198 A1* | 6/2016 | Kwon | H01L 27/14612 257/435 |
| 2016/0218086 A1 | 7/2016 | Moda | |
| 2017/0092680 A1* | 3/2017 | Kwon | H01L 27/1462 |
| 2017/0229385 A1 | 8/2017 | Harikai et al. | |
| 2017/0345798 A1 | 11/2017 | Yu et al. | |
| 2018/0090443 A1* | 3/2018 | Lee | H01L 23/5389 |
| 2018/0158749 A1* | 6/2018 | Yu | H01L 23/3736 |
| 2018/0166420 A1 | 6/2018 | Park et al. | |
| 2018/0279825 A1* | 10/2018 | He | A47J 43/04 |
| 2018/0315740 A1 | 11/2018 | Im et al. | |
| 2019/0043823 A1 | 2/2019 | Venkatadri et al. | |
| 2019/0333889 A1 | 10/2019 | Kurogi | |
| 2019/0348336 A1 | 11/2019 | Katkar et al. | |
| 2020/0020641 A1 | 1/2020 | Ko et al. | |
| 2020/0091100 A1 | 3/2020 | Han et al. | |
| 2020/0135636 A1 | 4/2020 | Lee et al. | |

FOREIGN PATENT DOCUMENTS

| | | |
|---|---|---|
| GB | 2 150 749 A | 7/1985 |
| JP | S60-3147 A | 1/1985 |
| JP | 10-2003-0002476 A | 1/2003 |
| JP | 2013-069814 A | 4/2013 |
| JP | 2017-168511 A | 9/2017 |
| KR | 10-1550551 B1 | 9/2015 |
| KR | 10-2018-0067973 A | 6/2018 |
| WO | 2015/062990 A1 | 5/2015 |

OTHER PUBLICATIONS

Machine translation, Herrmann, WIPO Pat. Pub. No. WO 2015062990, translation date: Feb. 26, 2021, Espacenet, all pages. (Year: 2021).
Machine translation, Haneda, Japanese Pat. Pub. No. S60-3147-A, translation date: Jan. 28, 2021, Espacenet, all pages (Year: 2021).
Communication dated May 31, 2021 issued by the European Patent Office in European Application No. 19204283.6.
Lu, Jian-Qiang, et al., "Hybrid Metal/Polymer Wafer Bonding Platform", Hybrid Metal/Dielectric Bonding, Handbook of Wafer Bonding, 2012, p. 215-236 (23 pages).
Communication dated Jan. 28, 2022 by the Intellectual Property Office of Singapore in Singapore Patent Application No. 10201907297Y.
Communication dated Feb. 10, 2022 by the Intellectual Property Office of India in Indian Patent Application No. 201944037715.

* cited by examiner

SEMICONDUCTOR PACKAGE

CROSS-REFERENCE TO RELATED APPLICATIONS

This is a Continuation of U.S. application Ser. No. 16/451,944 filed on Jun. 25, 2019, now U.S. Pat. No. 11,056,432, issued Jul. 6, 2021, which claims priority from Korean Patent Application No. 10-2018-0127736 filed on Oct. 24, 2018 in the Korean Intellectual Property Office, the disclosures of which are incorporated herein by reference in their entireties.

BACKGROUND

1. Field

Example embodiments of the present disclosure relate to a semiconductor package.

2. Related Art

Various types of semiconductor packages have been developed, as demand for high capacity, thinning and miniaturization of electronic products has increased.

SUMMARY

One or more example embodiments provide a semiconductor package having a reduced thickness.

One or more example embodiments provide a semiconductor package in which a semiconductor chip may be mounted without defects.

According to an aspect of an example embodiment, there is provided a semiconductor package. The semiconductor package includes a lower structure including an upper insulating layer and an upper pad; and a semiconductor chip provided on the lower structure and comprising a lower insulating layer and a lower pad. The lower insulating layer is in contact with and coupled to the upper insulating layer and the lower pad is in contact with and coupled to the upper pad, and a lateral side of the semiconductor chip extends between an upper side and a lower side of the semiconductor chip and comprises a recessed portion.

According to an aspect of an example embodiment, there is provided a semiconductor package. The semiconductor package includes a lower structure; and a semiconductor chip provided on the lower structure and having an upper side a lower side that opposes the upper side. The lower structure includes an upper pad and an upper insulating layer, the semiconductor chip includes a lower pad and a lower insulating layer that are provided at the lower side of the semiconductor chip, the lower pad is in contact with and coupled to the upper pad, the lower insulating layer is in contact with and coupled to the upper insulating layer, and the lower side of the semiconductor chip is narrower than the upper side of the semiconductor chip.

According to an aspect of an example embodiment, there is provided a semiconductor package. The semiconductor package includes a lower structure; and a plurality of semiconductor chips provided on the lower structure. The plurality of semiconductor chips includes a first semiconductor chip and a second semiconductor chip in direct contact with each other, the first semiconductor chip has a first upper side and a first lower side that opposes the first upper side, the second semiconductor chip has a second upper side and a second lower side that opposes the second upper side, the first semiconductor chip includes an upper insulating layer and an upper pad that are provided at the first upper side of the first semiconductor chip, the second semiconductor chip includes a lower insulating layer and a lower pad that are provided at the second lower side of the second semiconductor chip, the lower insulating layer and the upper insulating layer are in contact with and coupled to each other, the lower pad and the upper pad are in contact with and coupled to each other, and the second lower side of the second semiconductor chip is narrower than the second upper side of the second semiconductor chip.

BRIEF DESCRIPTION OF DRAWINGS

The above and other aspects, features, and advantages of will be more clearly understood from the following detailed description, taken in conjunction with the accompanying drawings, in which.

DETAILED DESCRIPTION

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present.

Figure 1:
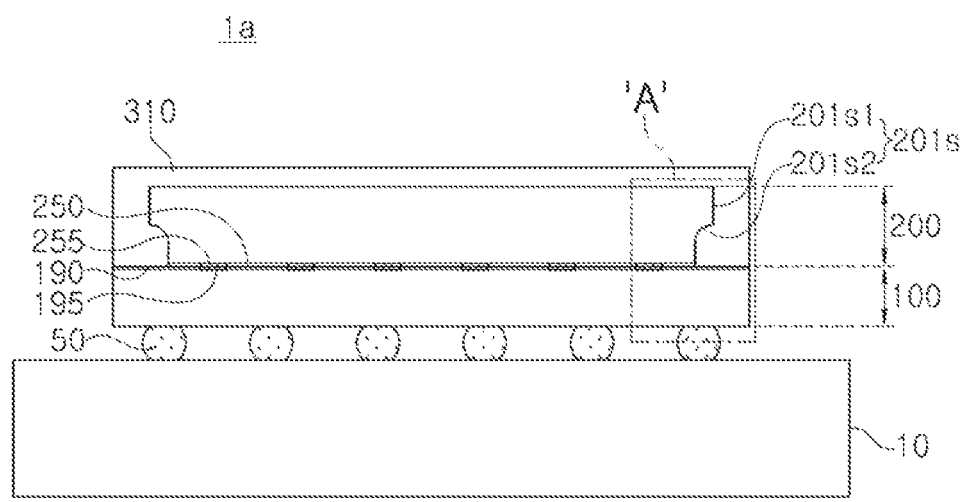
FIG. 1 is a cross-sectional view illustrating an example of a semiconductor package according to an example embodiment.

FIG. 1 is a cross-sectional view illustrating an example of a semiconductor package according to an example embodiment.

Referring to FIG. 1, a semiconductor package 1a may include a lower structure 100 and a semiconductor chip 200 on the lower structure 100. The semiconductor chip 200 may be a memory semiconductor chip or a logic semiconductor chip. For example, the memory semiconductor chip may be a volatile memory chip, such as a dynamic random access memory (DRAM) or a static random access memory (SRAM), or may be a nonvolatile memory chip such as a phase-change random access memory (PRAM), a magnetoresistive random access memory (MRAM), a ferroelectric random access memory (FeRAM), or a resistive random access memory (RRAM). The logic semiconductor chip may be a microprocessor, an analog device, or a digital signal processor.

In an example, the lower structure 100 may be a lower semiconductor chip different from the semiconductor chip 200, but an example embodiment thereof is not limited thereto. For example, the lower structure 100 may also be an interposer.

The lower structure 100 may include an upper insulating layer 190 and an upper pad 195. The semiconductor chip 200 may include a lower semiconductor insulating layer 250 in contact with and coupled to the upper insulating layer 190, and a lower semiconductor pad 255 in contact with and coupled to the upper pad 195. The semiconductor chip 200 may include a lateral side 201s containing a first portion 201s1 and a second portion 201s2 of an undercut shape recessed as compared with the first portion 201s1.

The upper pad 195 and the lower semiconductor pad 255 may be formed of a conductive material, for example, copper or the like, and may be combined and in contact with each other.

The upper insulating layer 190 and the lower semiconductor insulating layer 250 may be formed of an insulating material, for example, silicon oxide, and may be combined and in contact with each other. A material of the upper insulating layer 190 and the lower semiconductor insulating layer 250 may be formed of SiCN or the like, without being limited to silicon oxide.

The semiconductor package 1a may further include a molding layer 310 disposed on the lower structure 100 and covering the semiconductor chip 200.

The semiconductor package 1a may further include a base 10 below the lower structure 100 and a connection structure 50 physically connecting the base 10 and the lower structure 100. The base 10 may be a printed circuit board, an interposer or a semiconductor chip. The connection structure 50 may be a solder ball or a bump.

Next, various examples of the lower structure 100 and the semiconductor chip 200 will be described with reference to FIGS. 2 to 5. FIGS. 2 to 5 are partially enlarged views illustrating various examples of portion "A" in FIG. 1.

Figure 2:
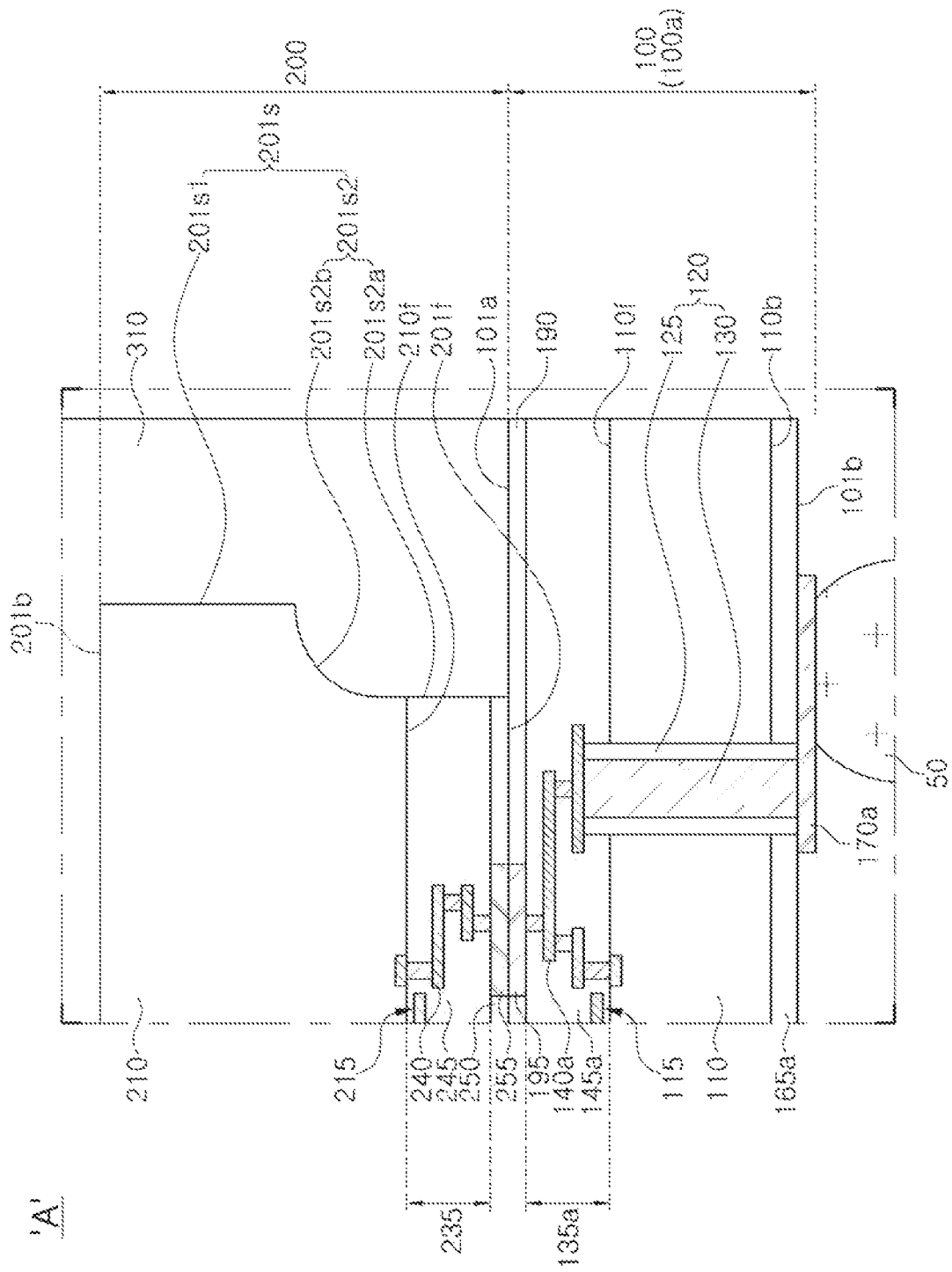
FIGS. 2 to 5 are partially enlarged views illustrating various examples of portion "A" in FIG. 1.

In an example, referring to FIGS. 1 and 2, the semiconductor chip 200 described above includes a first side 201f contacting the lower structure 100, and a second side 201b opposing the first side 201f. The first side 201f may be referred to as a "lower side", and the second side 201b may be referred to as an "upper side".

The semiconductor chip 200 may include a semiconductor body 210, a semiconductor internal circuit region 235, the lower semiconductor insulating layer 250 and the lower semiconductor pad 255. The semiconductor internal circuit region 235 may be disposed below the semiconductor body 210, and the lower semiconductor insulating layer 250 and the lower semiconductor pad 255 may be disposed below the semiconductor internal circuit region 235.

The semiconductor body 210 may be a semiconductor substrate, and the semiconductor internal circuit region 235 may be disposed on a lower side 210f of the semiconductor body 210.

The semiconductor internal circuit region 235 may include a semiconductor internal circuit 215 and a semiconductor internal interconnection 240 electrically connecting the semiconductor internal circuit 215 and the lower semiconductor pad 255. The semiconductor internal circuit 215 and the semiconductor internal interconnection 240 may be disposed within a semiconductor internal insulating layer 245.

The semiconductor chip 200 may have the lower side 201f and the upper side 201b opposing each other. The lower side 201f of the semiconductor chip 200 may be brought into contact with and coupled to the lower structure 100. In the semiconductor chip 200, the lower side 201f may have a width less than that of the upper side 201b. The semiconductor internal circuit region 235 may have a width less than a width of the upper side 201b of the semiconductor chip 200.

The lateral side 201s of the semiconductor chip 200 includes the first portion 201s1 and second portion 201s2. The first portion 201s1 may extend from an edge of the upper side 201b in a direction substantially perpendicular to the upper side 201b, and the second portion 201s2 may extend from an edge of the lower side 201f to the first portion 201s1. The second portion 201s2 includes a vertical portion 201s2a extending from an edge of the lower side 201f in a direction substantially perpendicular to the lower side 201f, and a curved portion 201s2b extending from the vertical portion 201s2a to the first portion 201s1.

The lower structure 100 illustrated in FIG. 1 may correspond to a lower structure 100a illustrated in FIG. 2. The lower structure 100a may include a first side 101a and a second side 101b opposing the first side 101a. The lower structure 100a may include a lower body 110, a lower protective insulating layer 165a and a lower connection pad 170a below the lower body 110, a lower internal circuit region 135a on the lower body 110, and the upper insulating layer 190 and the upper pad 195 on the lower internal circuit region 135a. The lower body 110 may be a semiconductor substrate such as a silicon substrate or the like. The lower internal circuit region 135a may be disposed on an upper side 110f of the lower body 110, and the lower protective insulating layer 165a and the lower connection pad 170a may be disposed on a lower side 110b of the lower body 110.

The lower structure 100a may include a penetrating electrode structure 120 penetrating through the lower body 110 to electrically connect the lower connection pad 170a and the upper pad 195. The penetrating electrode structure 120 may include a penetrating electrode 130 formed of a conductive material such as copper or the like, and an insulating spacer 125 surrounding a lateral side of the penetrating electrode 130. The lower internal interconnection 140a may be electrically connected the upper pad 195 and the penetrating electrode 120. The upper pad 195 may be electrically connected to the lower connection pad 170a by the lower internal interconnection 140a and the penetrating electrode 120.

The lower internal circuit region 135a may include a lower internal circuit 115 and a lower internal interconnection 140a electrically connecting the lower internal circuit 115 and the upper pad 195. The lower internal circuit 115 and the lower internal interconnection 140a may be disposed in the lower internal insulating layer 145a.

Thus, the lower structure 100 may be a semiconductor chip 100a including the lower internal circuit region 135a facing the semiconductor chip 200.

Figure 3:
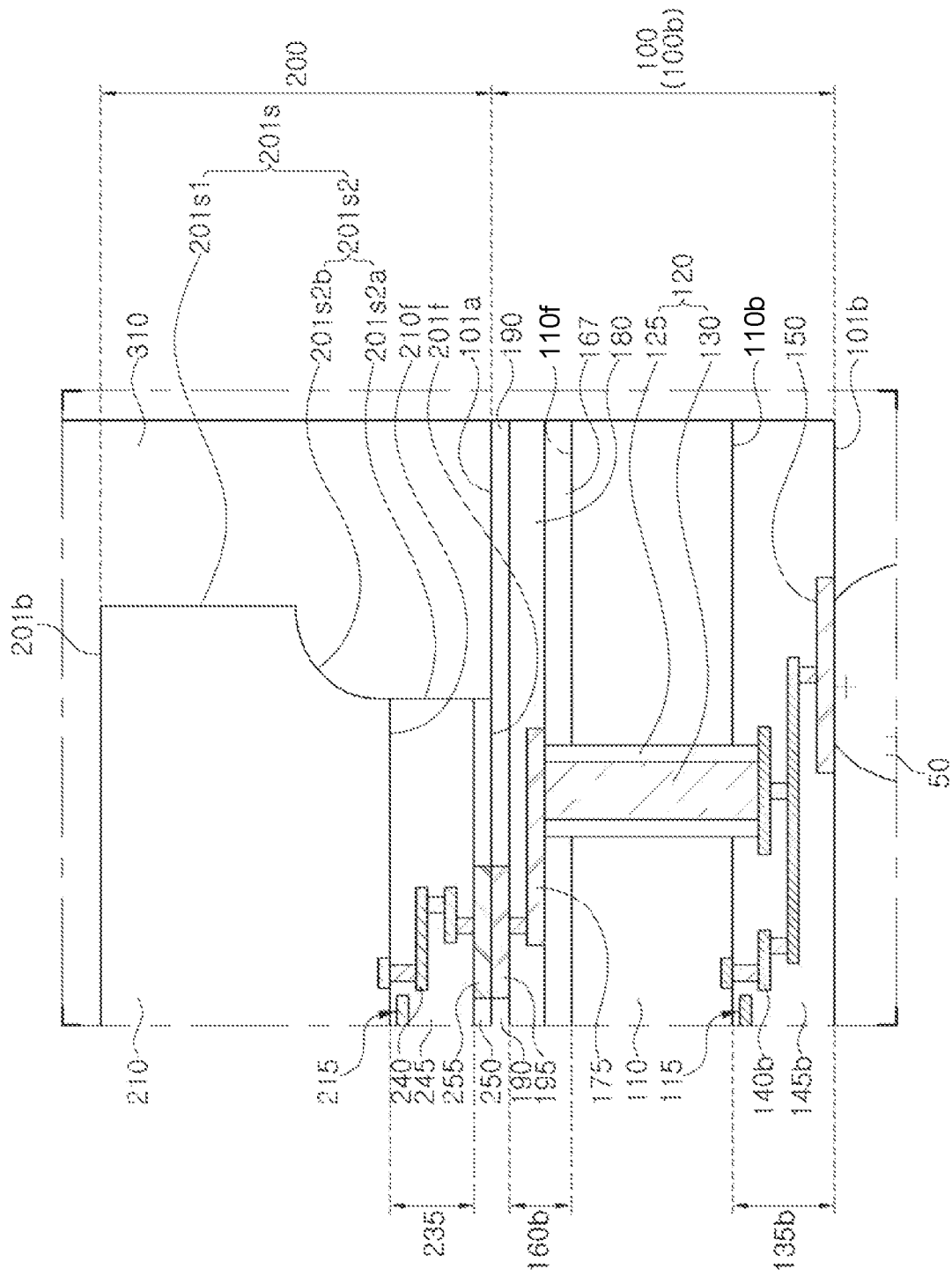

In a modified example, referring to FIGS. 1 and 3, the lower structure 100 described above with reference to FIG. 1 may correspond to a lower structure 100b illustrated in FIG. 3. The lower structure 100b may include a first side 101a and a second side 101b opposing the first side 101a. The lower structure 100b may include a lower body 110, a redistribution region 160b disposed on an upper side 110f of the lower body 110, a lower internal circuit region 135b disposed on a lower side 110b of the lower body 110, and the upper insulating layer 190 and the upper pad 195 disposed on the redistribution region 160b.

The lower internal circuit region 135b may include a lower internal circuit 115, a lower internal interconnection 140b electrically connected to the lower internal circuit 115, and a lower connection pad 150 electrically connected to the lower internal interconnection 140b. The lower internal circuit 115 and the lower internal interconnection 140b may be disposed in the lower internal insulating layer 145b. The lower connection pad 150 may be connected to the connection structure 50 described above.

The redistribution region 160b may include a redistribution pattern 175, a first redistribution insulating layer 167 between the redistribution pattern 175 and the lower body 110, and a second redistribution insulating layer 180 between the first redistribution insulating layer 167 and the upper insulating layer 190.

The lower structure 100b may include a penetrating electrode structure 120 penetrating through the lower body 110 and electrically connecting the lower internal interconnection 140b and the redistribution pattern 175 to each other. Thus, the upper pad 195 and the lower connection pad 150 of the lower structure 100b may be electrically connected to each other through the penetrating electrode structure 120.

Thus, the lower structure 100 may be a semiconductor chip 100b that includes the lower internal circuit region 135b. The lower internal circuit region 135b is formed on the lower side 110b of the lower body 110, an upper side 110f of the lower body 110 faces the semiconductor chip 200, and the lower internal circuit region 135b faces the base 10.

Figure 4:
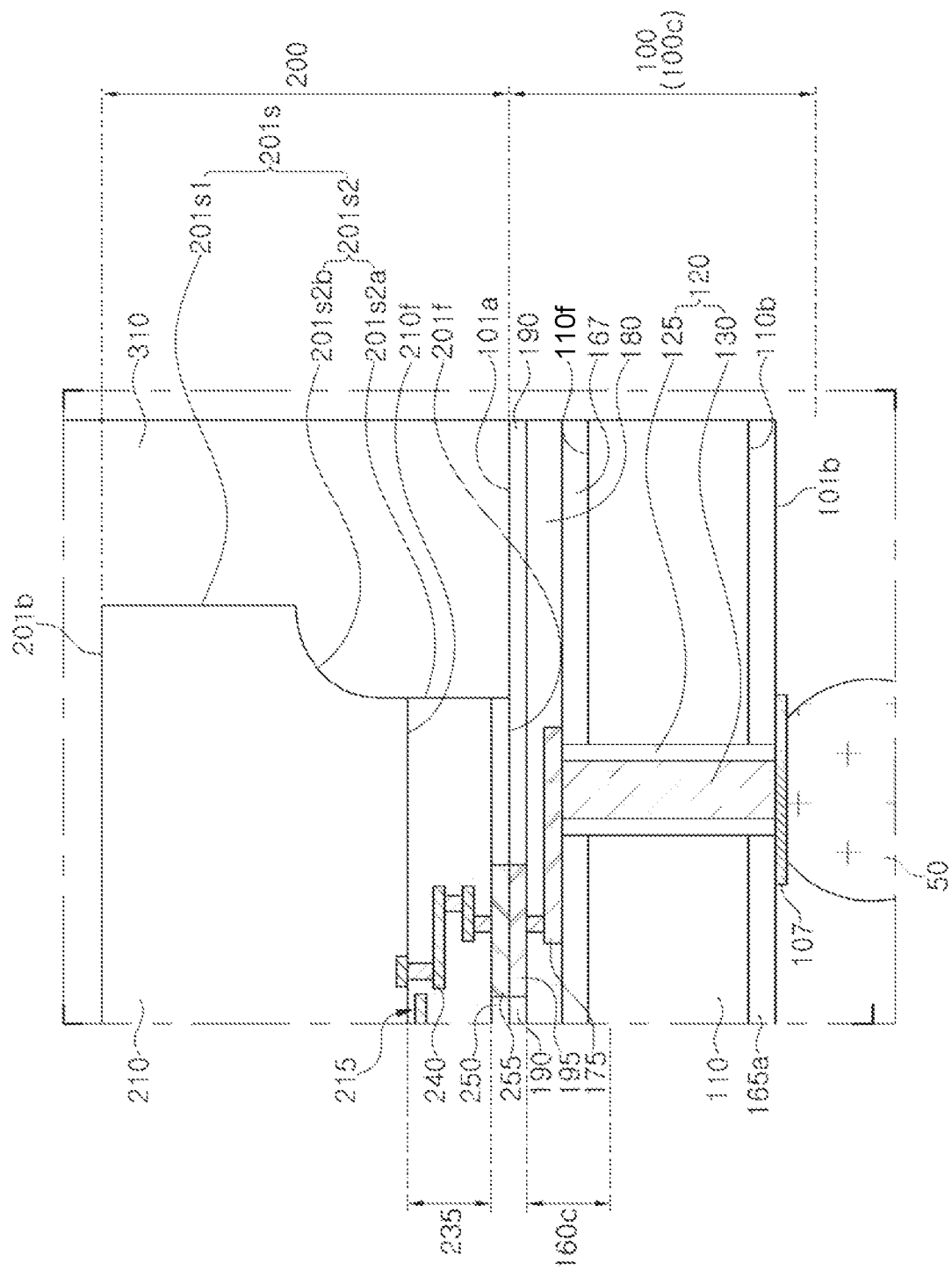

In a modified example, referring to FIGS. 1 and 4, the lower structure 100 described above with reference to FIG. 1 may correspond to a lower structure 100c illustrated in FIG. 4. The lower structure 100c may include a first side 101a and a second side 101b opposing the first side 101a. The lower structure 100c may include a lower body 110, a redistribution region 160c disposed on an upper side 110f of the lower body 110, a lower protective insulating layer 165a and a lower connection pad 107 formed on the lower side 110b of the lower body 110, and the upper insulating layer 190 and the upper pad 195 disposed on the redistribution region 160c.

The redistribution region 160c may include the redistribution pattern 175, the first redistribution insulating layer 167, and the second redistribution insulating layer 180, in a manner similar to the redistribution region 160b described with reference to FIG. 3. The lower structure 100c may include a penetrating electrode structure 120 penetrating through the lower body 110 and electrically connecting the redistribution pattern 175 and the lower connection pad 107.

Thus, the lower structure 100c may be an interposer including the redistribution region 160c facing the semiconductor chip 200.

Figure 5:
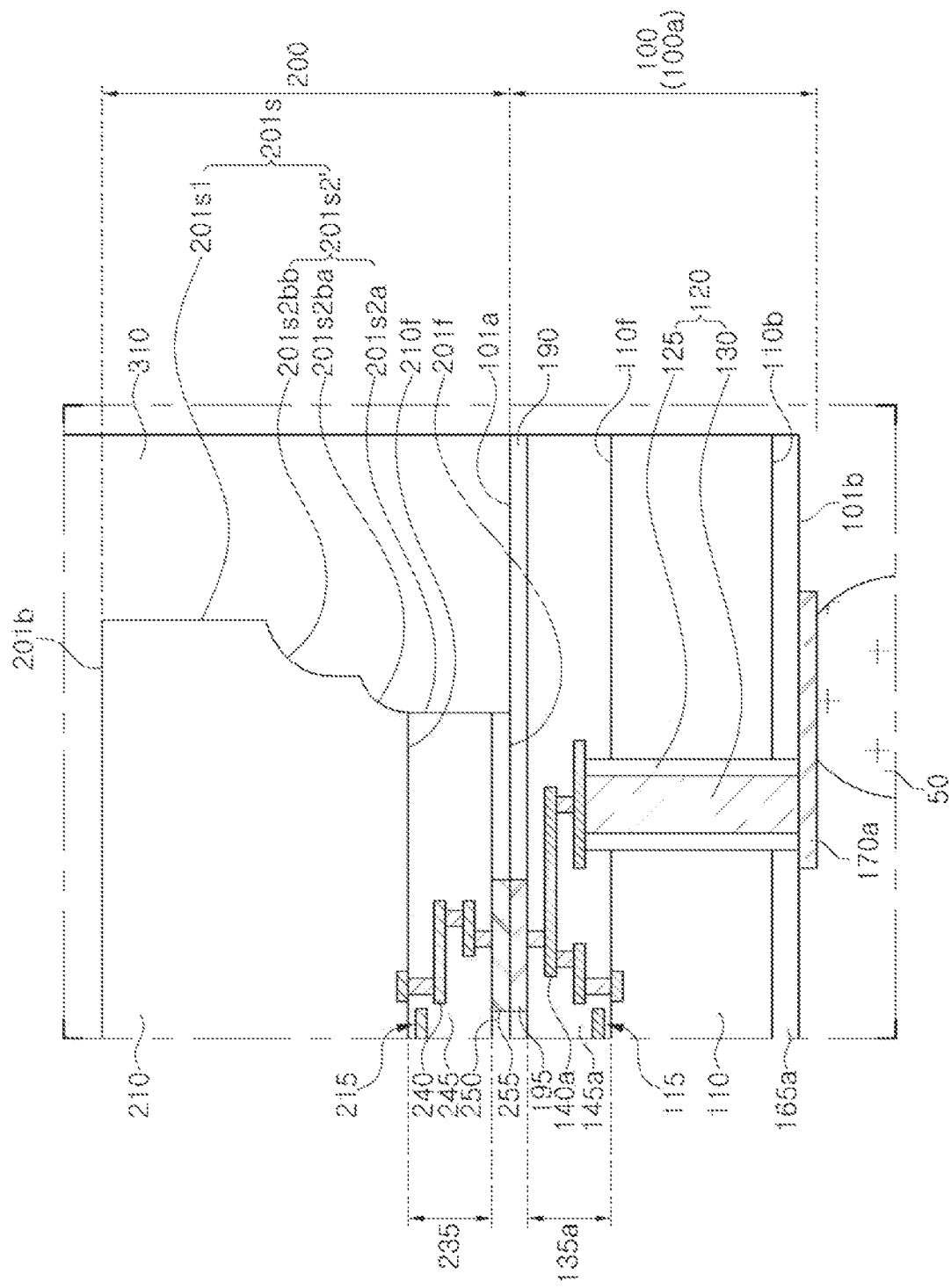

In a modified example, referring to FIGS. 1 and 5, the lateral side 201s of the semiconductor chip 200 may include a modified second portion 201s2', together with the first portion 201s1 described above with reference to FIGS. 1 and 2. In this case, because the remaining components, other than the second portion 201s2' of the lateral side 201s, are described above with reference to FIGS. 1 and 2, a detailed description thereof will be omitted.

The second portion 201s2' of the semiconductor chip 200 may include a vertical portion 201s2a extending from an edge of the lower side 201f of the semiconductor chip 200 in a direction substantially perpendicular to the lower side 201f, a first curved portion 201s2ba extending from the vertical portion 201s2a, and a second curved portion 201s2bb extending from the first curved portion 201s2ba to the first portion 201s1 and distinguished from the first curved portion 201s2ba.

Figure 6:
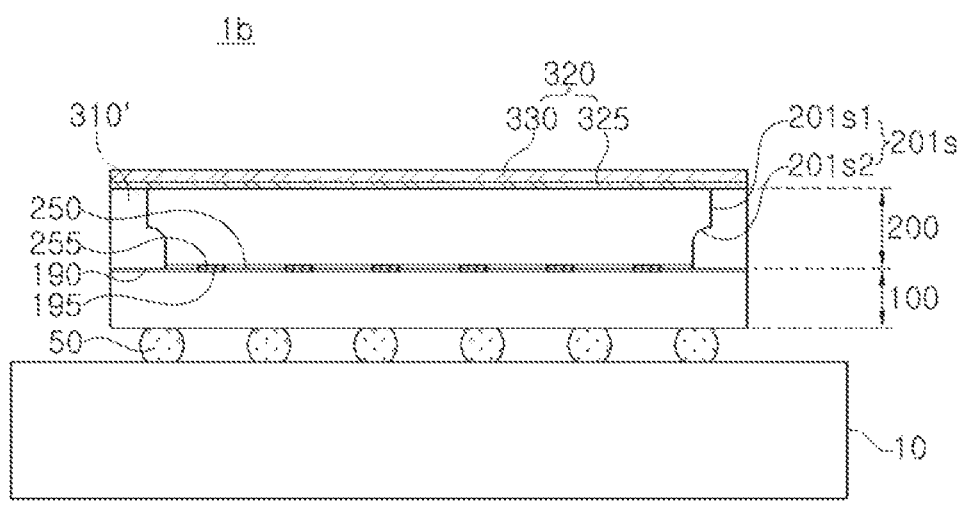
FIG. 6 is a cross-sectional view illustrating a modified example of the semiconductor package according to an example embodiment.

A semiconductor package according to an example embodiment will be described with reference to FIG. 6. FIG. 6 is a cross-sectional view illustrating a semiconductor package according to an example embodiment.

As illustrated in FIG. 6, a semiconductor package 1b may include the base 10, the lower structure 100 on the base 10 and the semiconductor chip 200 on the lower structure 100, in a manner similar to FIG. 1. The semiconductor package 1b may include a molding layer 310' covering the lateral sides 201s of the semiconductor chip 200.

The semiconductor package 1b may include a heat dissipation structure 320 covering the semiconductor chip 200 and a molding layer 310'. The heat dissipation structure 320 may include an insulating heat conduction layer 325 and a heat dissipation plate 330. The heat dissipation plate 330 may be formed of a metallic material, capable of externally radiating heat generated in the semiconductor chip 200. The insulating heat conduction layer 325 may couple the heat dissipation plate 330 to the semiconductor chip.

Figure 7:
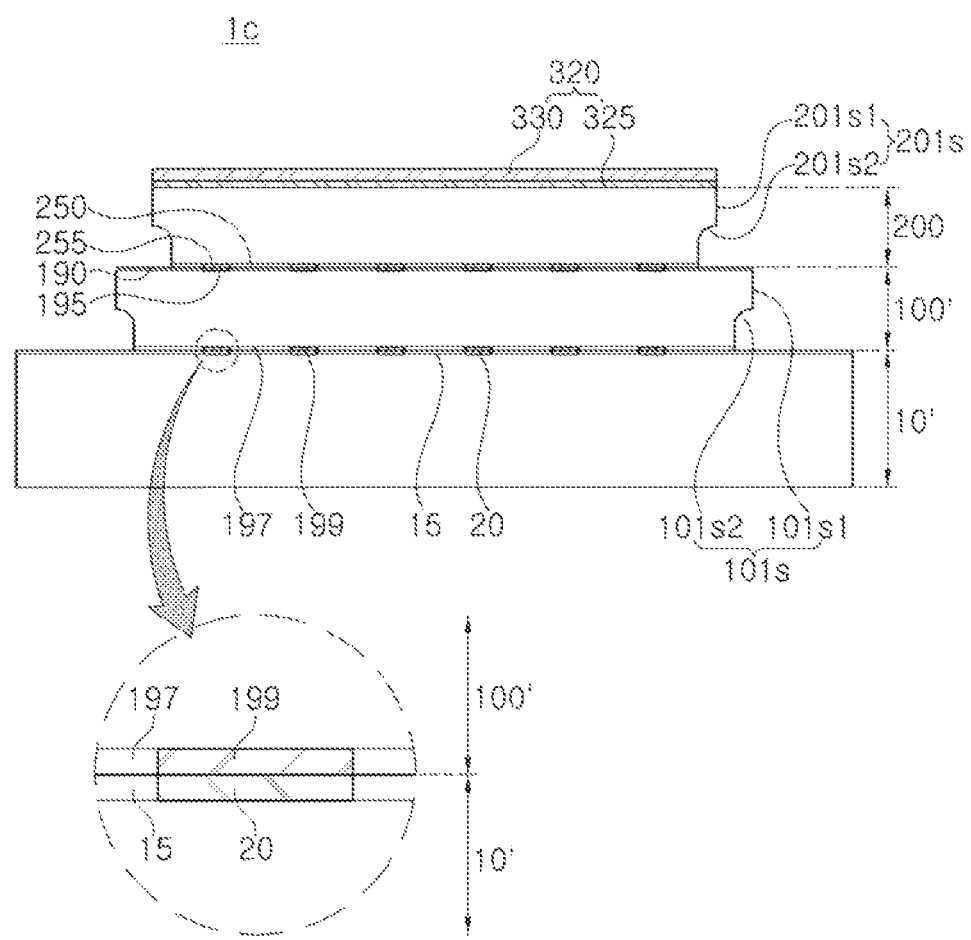
FIG. 7 is a cross-sectional view illustrating a modified example of the semiconductor package according to an example embodiment.

FIG. 7 is a cross-sectional view illustrating a semiconductor package according to an example embodiment.

Referring to FIG. 7, a semiconductor package 1c may include a base 10', a lower structure 100' on the base 10', and a semiconductor chip 200 on the lower structure 100'.

The base 10' may include a base insulating layer 15 and a base pad 20.

The lower structure 100' may include a lower insulating layer 197 in contact with and coupled to the base insulating layer 15, and a lower pad 199 in contact with and coupled to the base pad 20.

The semiconductor chip 200 may be similar to the semiconductor chip described above. For example, the semiconductor chip 200 may include the lower semiconductor insulating layer 250 and the lower semiconductor pad 255 as described above, and may include the lateral side 201s having the first portion 201s1 and second portion 201s2, as described above. The lower structure 100' may include an upper insulating layer 190 in contact with and coupled to the lower semiconductor insulating layer 250 of the semiconductor chip 200, and an upper pad 195 in contact with and coupled to the lower semiconductor pad 255 of the semiconductor chip 200. A lateral side 101s of the lower structure 100' may include a first portion 101s1 and a second portion 101s2. The second portion 101s2 may be further recessed as compared with the first portion 101s1. The second portion 101s2 of the lower structure 100' extends from a surface of the lower structure 100', and is in contact with and coupled to the base 10'. The first portion 101s1 of the lower structure 100' may extend from an edge of the lower structure 100'.

Figure 8:
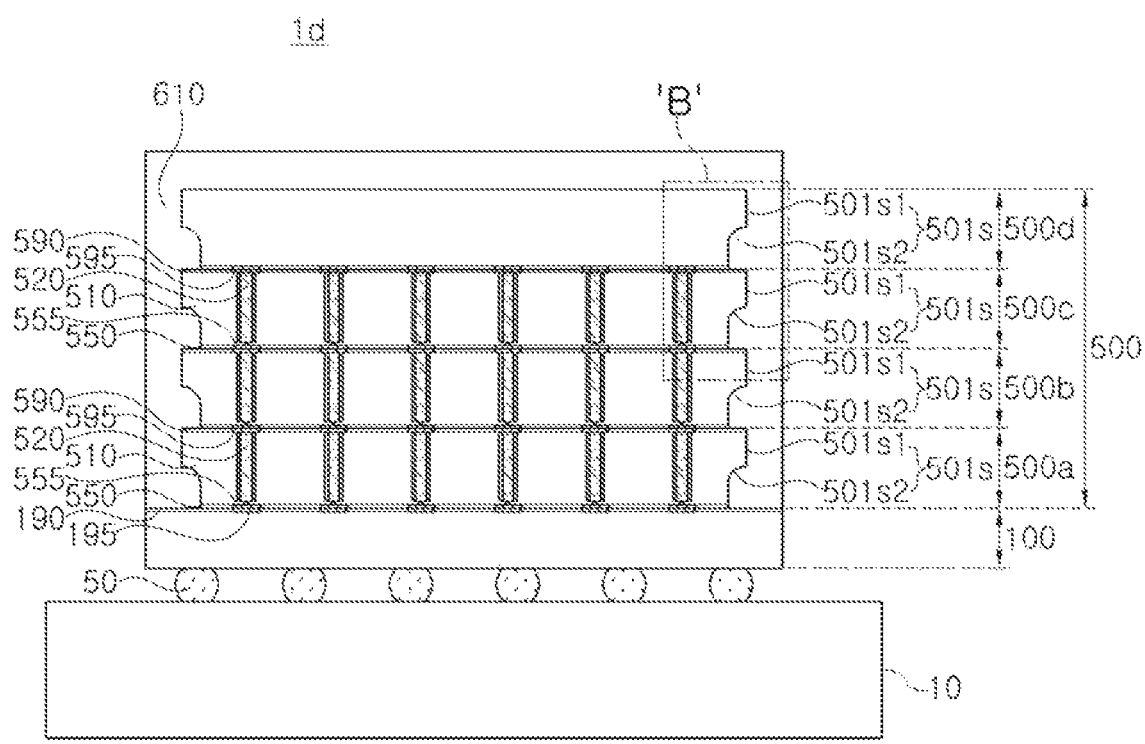
FIG. 8 is a cross-sectional view illustrating a modified example of the semiconductor package according to an example embodiment.
Figure 9:
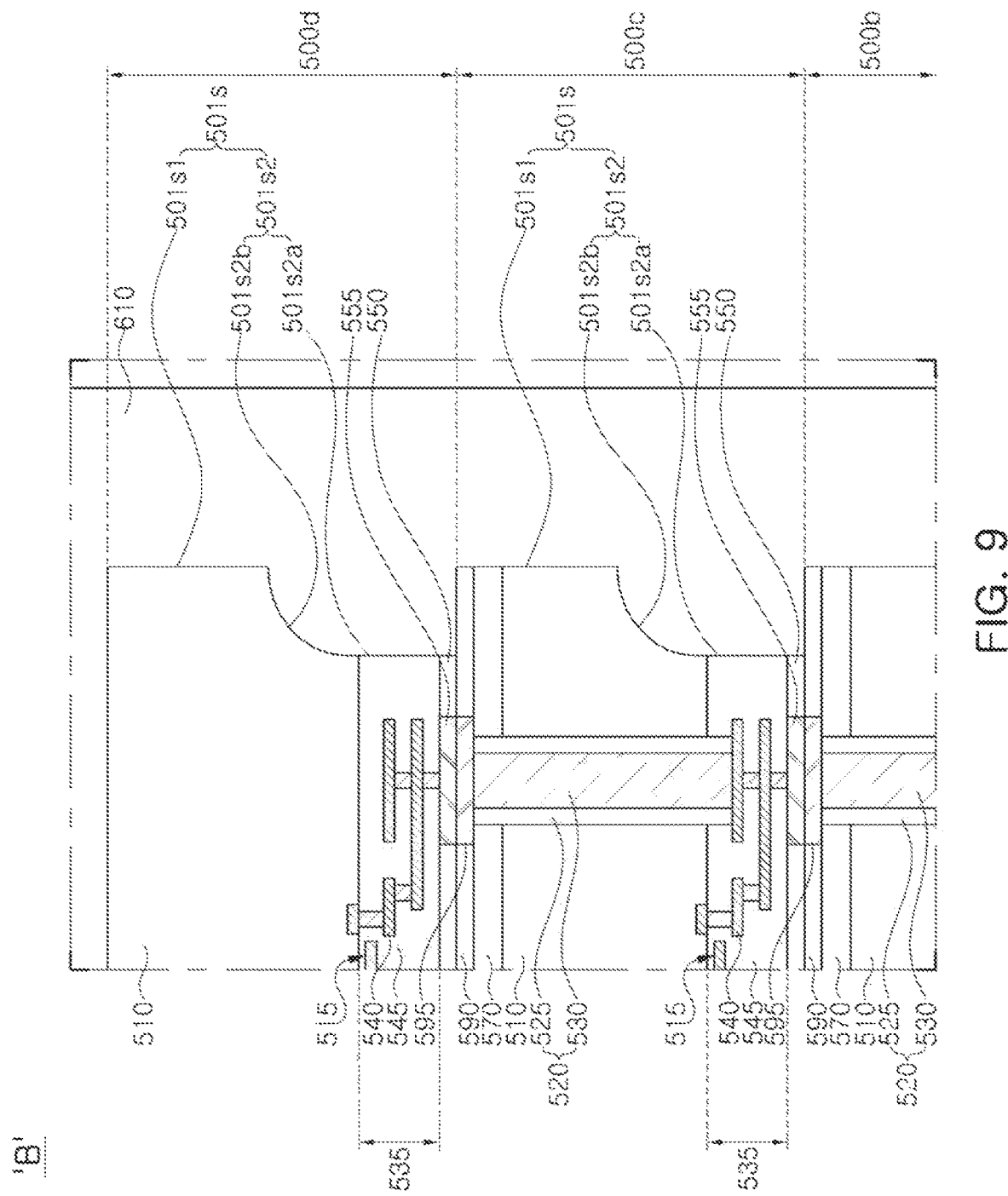
FIG. 9 is a partially enlarged view of portion "B" in FIG. 8.

FIG. 8 is a cross-sectional view illustrating a modified example of the semiconductor package according to an example embodiment, and FIG. 9 is a partially enlarged view of portion 'B' of FIG. 8.

Referring to FIGS. 8 and 9, a semiconductor package 1d may include a base 10, a lower structure 100 coupled to the base 10 by a connection structure 50 above the base 10, and a plurality of semiconductor chips 500 above the lower structure 100.

In an example, the base 10 may be a printed circuit board or a semiconductor chip.

In an example, the lower structure 100 may be similar to the lower structure described in FIG. 1.

In an example, the plurality of semiconductor chips 500 may include one or more lower semiconductor chips 500a, 500b and 500c, and an upper semiconductor chip 500d on the one or more lower semiconductor chips 500a, 500b and 500c.

In an example, in the case of the plurality of lower semiconductor chips 500a, 500b and 500c, the plurality of lower semiconductor chips 500a, 500b and 500c may have similar shapes or similar structures.

Each of the plurality of semiconductor chips 500 includes a lateral side 501s containing a first portion 501s1 and a second portion 501s2 extending from the first portion 501s1 and further recessed as compared with the first portion 501s1. The first portion 501s1 and the second portion 501s2 of the lateral side 501s may have a shape or structure similar to that of the first portion 201s1 and the second portion 201s2 of the lateral side 201s described above with reference to FIGS. 1 and 2. Thus, a detailed description of the first portion 501s1 and the second portion 501s2 of the lateral side 501s will be omitted.

Each of the plurality of semiconductor chips 500 may include a semiconductor body 510, a semiconductor internal circuit region 535 below the semiconductor body 510, and a lower semiconductor insulating layer 550 and a lower semiconductor pad 555 below the semiconductor internal circuit region 535. The semiconductor body 510 may be a semiconductor substrate such as a silicon substrate. The semiconductor internal circuit region 535 may include a semiconductor internal circuit 515 and a semiconductor internal interconnection 540 electrically connecting the semiconductor internal circuit 515 and the lower semiconductor pad 555 to each other.

Each of the lower semiconductor chips 500a, 500b and 500c in the plurality of semiconductor chips 500 may further include an upper semiconductor insulating layer 590 and an upper semiconductor pad 595 on the semiconductor body 510. Each of the lower semiconductor chips 500a, 500b and 500c in the plurality of semiconductor chips 500 may further include a semiconductor protection insulating layer 570 between the semiconductor body 510 and the upper semiconductor insulating layer 590.

Each of the lower semiconductor chips 500a, 500b and 500c may include a semiconductor penetration electrode structure 520 penetrating through the semiconductor body 510 and electrically connecting the lower semiconductor pad 555 and the upper semiconductor pad 595 to each other. The semiconductor penetration electrode structure 520 may include a penetrating electrode 530 formed of a conductive material, such as copper or the like, and an insulating spacer 525 surrounding a lateral side of the penetrating electrode 530.

Among the semiconductor chips 500, the upper semiconductor insulating layer 590 of a semiconductor chip located in a relatively low position, and the lower semiconductor insulating layer 550 of a semiconductor chip located in a relatively high position, may be in contact with and coupled to each other. In addition, among the semiconductor chips 500, the upper semiconductor pad 595 of a semiconductor chip located in a relatively low position, and the lower semiconductor pad 555 of a semiconductor chip located in a relatively high position, may be in contact with and coupled to each other. Thus, the semiconductor chips 500 may be sequentially stacked, as the upper semiconductor insulating layer 590 and the lower semiconductor insulating layer 550 are in contact with and coupled to each other and the upper semiconductor pad 595 and the lower semiconductor pad 555 are in contact with and coupled to each other.

A lowest semiconductor chip 500a among the lower semiconductor chips 500a, 500b and 500c may be coupled while being in contact with the lower structure 100. For example, the lower semiconductor insulating layer 550 of the lowermost semiconductor chip 500a may be in contact with the upper insulating layer 190 of the lower structure 100 to be coupled thereto, and the lower semiconductor pad 555 of the lowermost semiconductor chip 500a may be in contact with the upper pad 195 of the lower structure 100 to be coupled thereto.

Figure 10:
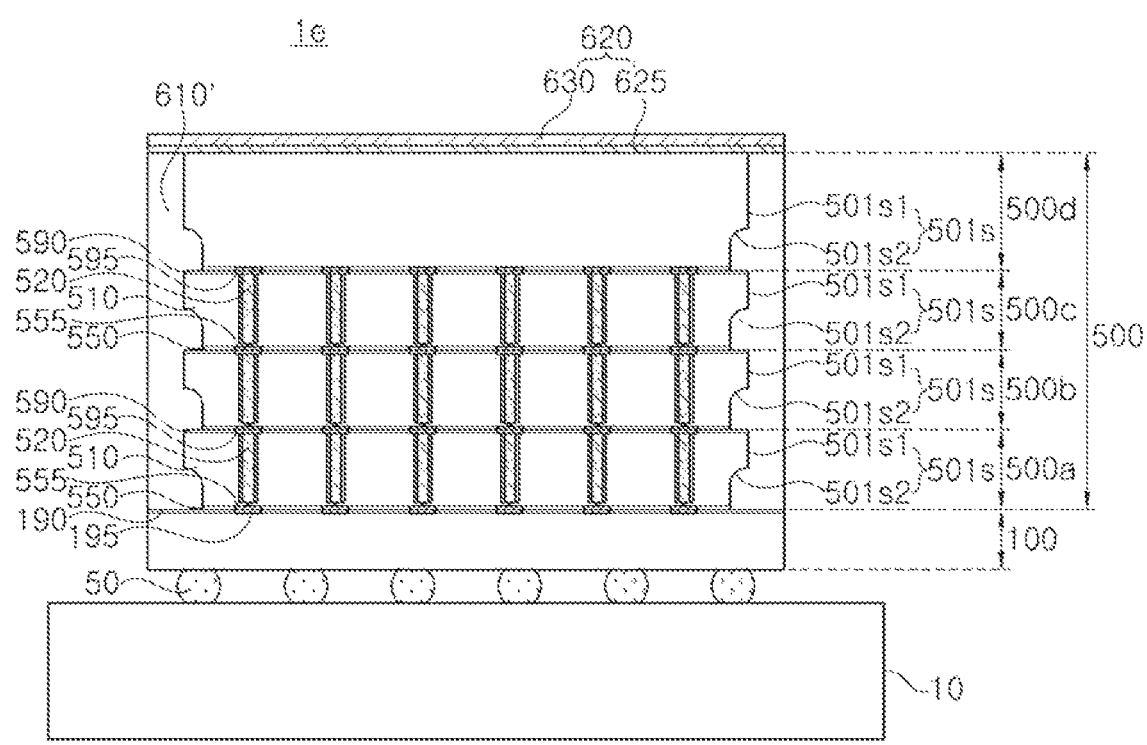
FIG. 10 is a cross-sectional view illustrating a modified example of the semiconductor package according to an example embodiment.

FIG. 10 is a cross-sectional view illustrating a semiconductor package according to an example embodiment.

As illustrated in FIG. 10, a semiconductor package 1e may include the base 10, the lower structure 100 on the base 10, and the plurality of semiconductor chips 500 on the lower structure 100.

The semiconductor package 1e may further include a molding layer 610' covering lateral sides 501s of the plurality of semiconductor chips 500, and a heat dissipation structure 620 covering an upper portion of the upper semiconductor chip 500d of the plurality of semiconductor chips 500 and the molding layer 610'. The heat dissipation structure 620 may include a heat dissipation plate 630 and an insulating heat conduction layer 625. The insulating heat conduction layer 625 may bond the heat dissipation plate 630 and the upper semiconductor chip 500d.

Figure 11:
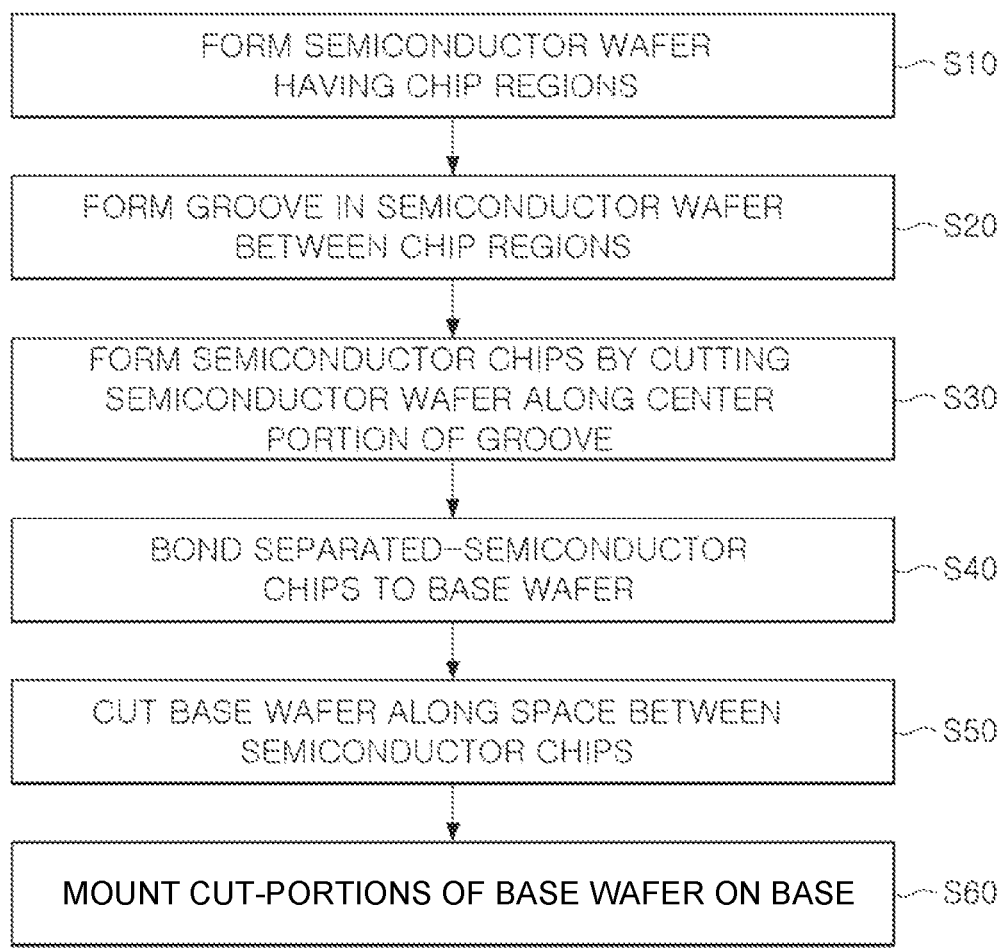
FIG. 11 is a flow chart illustrating an example of a method of forming a semiconductor package according to an example embodiment.

FIG. 11 is a process flow diagram illustrating an example of a method of forming a semiconductor package according to an example embodiment, and FIGS. 12A, 12B, 12C and 12D are cross-sectional views illustrating an example of a method of forming a semiconductor package according to an example embodiment.

Figure 12A:
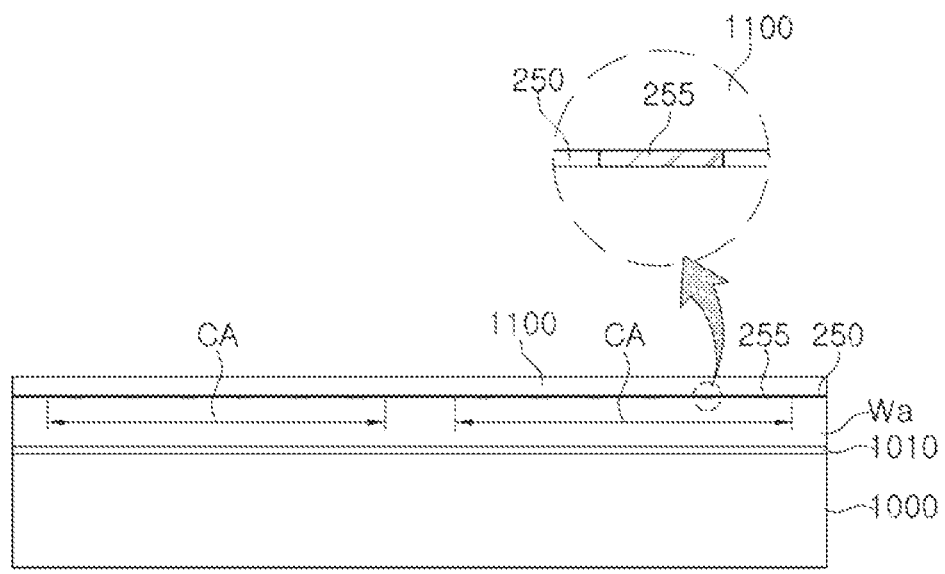
FIGS. 12A, 12B, 12C and 12D are cross-sectional views illustrating an example of a method of forming a semiconductor package according to an example embodiment.

Referring to FIGS. 11 and 12A, a semiconductor wafer Wa having chip regions CA may be formed in S10. The chip regions CA of the semiconductor wafer Wa may include a lower insulating layer 250 and a lower pad 255. A protective layer 1100, covering the lower insulating layer 250 and the lower pad 255, may be formed on the semiconductor wafer Wa.

The semiconductor wafer Wa may be adhered to a carrier substrate 1000 by an adhesive layer 1010 on the carrier substrate 1000.

Figure 12B:
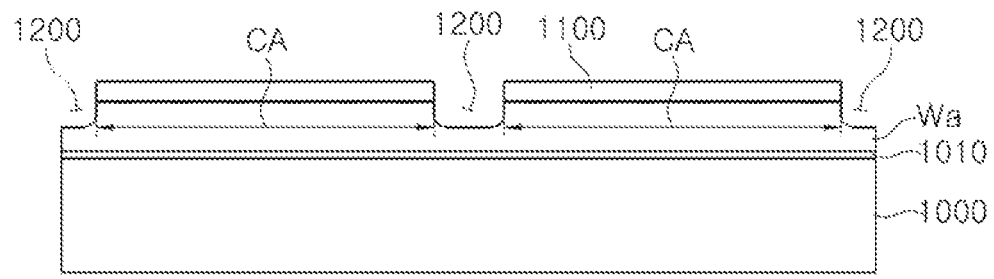

Referring to FIGS. 11 and 12B, a groove 1200 may be formed in the semiconductor wafer Wa between the chip regions CA in S20. The groove 1200 may penetrate through the lower insulating layer 250 and extend into the semiconductor wafer Wa. The groove 1200 may be formed, using a laser or using a blade having a relatively large width.

Figure 12C:
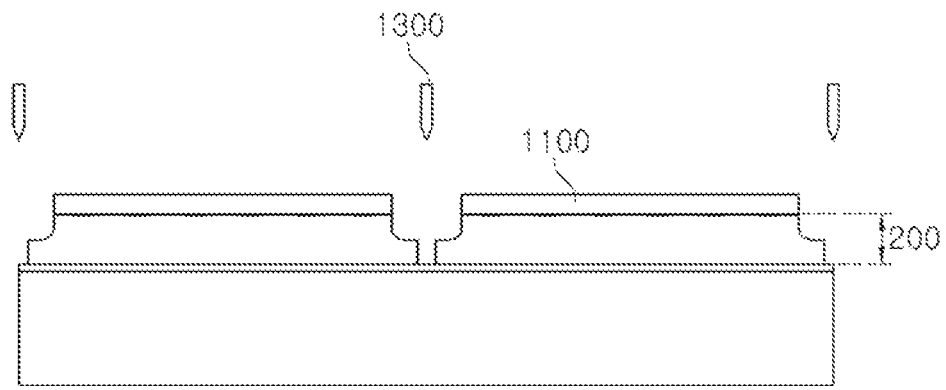
Figure 12D:
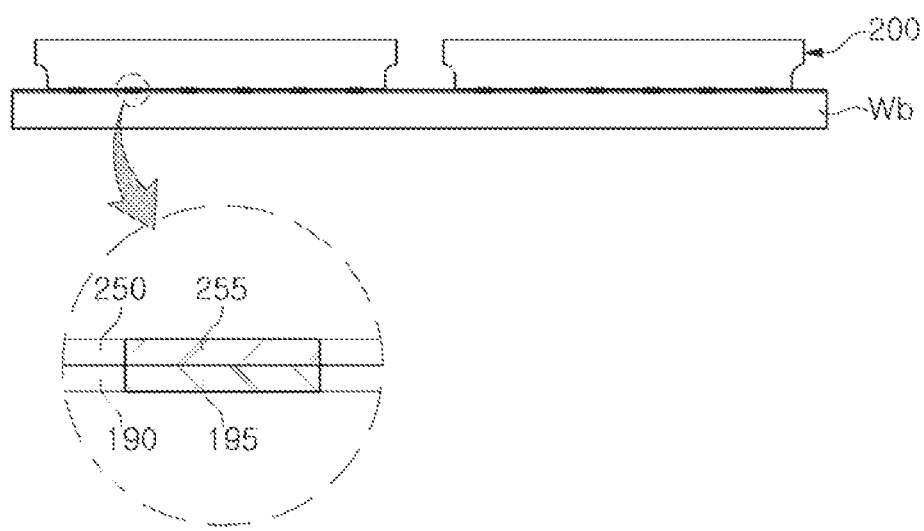

Referring to FIGS. 11, 12C and 12D, the semiconductor wafer Wa may be cut along a center portion of the groove 1200 to form the semiconductor chips 200 in S30. Cutting the semiconductor wafer Wa may include performing a sawing process 1300.

The protective layer 1100 remaining on the semiconductor chips 200 may be removed. The semiconductor chips 200 may be separated from the adhesive layer 1010 of the carrier substrate 1000. Then, the separated semiconductor chips 200 may be bonded to a base wafer Wb in S40.

The base wafer Wb may include an upper insulating layer 190 and an upper pad 195. The lower insulating layer 250 of the semiconductor chips 200 may be in contact with the upper insulating layer 190 and coupled thereto, and the lower pad 255 of the semiconductor chips 200 may be in contact with and coupled to the upper pad 195.

Bonding the semiconductor chips 200 to the base wafer Wb may be performed by positioning the semiconductor chips 200 on the base wafer Wb, and bonding the upper pads 195 of the base wafer Wb and the lower pads 255 of the semiconductor chips 200 to each other. Bonding the semiconductor chips 200 to the base wafer Wb may include applying pressure to the semiconductor chips 200 in a temperature atmosphere higher than room temperature. For example, the temperature atmosphere may be a thermal atmosphere of about 200° C. to about 300° C. The temperature of the thermal atmosphere is not limited to about 200° C. to about 300° C., and may be variously changed according to various example embodiments.

Referring to FIG. 11, the base wafer Wb may be cut along a space between the semiconductor chips 200 in S50. The method may further include forming a molding layer 310 covering the semiconductor chips 200 before cutting the base wafer Wb. Thus, the molding layer 310 may also be cut while the base wafer Wb is cut. Cut portions of the base wafer Wb may be mounted on the base 10 in S60. As discussed above, the base wafer Wb may include the upper insulating layer 190 and the upper pad 195. Thus, the semiconductor package 1a as described above with reference to FIG. 1 may be formed.

According to example embodiments, the lower structure 100 may be provided as a lower chip located in a relatively low position, and the semiconductor chip 200 may be provided as an upper chip located in a relatively high position. Thus, the semiconductor package, including the lower chip 100 and the upper chip 200 may be provided. The lower chip 100 and the upper chip 200 may be coupled to each other by pads 195 and 255, and by insulating layers 190 and 250. The pads 195 and 255 may be in direct contact with each other. The insulating layers 190 and 250 may be in direct contact with each other.

The semiconductor package according to example embodiments includes the lower chip 100 and the upper chip 200 described above, and thus, may have a reduced thickness.

According to example embodiments, an upper chip 200, located in a relatively high position, may include a recessed side portion 201s2. For example, the semiconductor wafer Wa is formed, the groove 1200 is formed in a side of the semiconductor wafer Wa, and a sawing process 1300 for cutting a center portion of the groove 1200 is performed, thereby forming the semiconductor chip, in detail, the upper chip 200. A portion of the upper chip 200 may remain to form the recessed side portion 201s2 of the upper chip 200, which forms the groove 1200. The recessed side portion 201s2 of the upper chip 200 may significantly reduce or prevent contamination of the upper chip 200 due to particles generated during the sawing process 1300. Thus, defects occurring in the process of directly contacting and coupling the upper chip 200 having a recessed lateral side to a lower structure located in a relatively low position, for example, to the lower chip 100 may be significantly reduced or may be prevented.

As set forth above, according to example embodiments, a semiconductor package, including pads directly contacting and coupled to each other, and insulating layers directly contacting and coupled to each other, may be provided. Thus, the pads and the insulating layers may combine chips, or may combine a semiconductor chip and an interposer. The chips, or the chip and the interposer, may be coupled to each other using the pads and the insulating layers, thereby reducing a thickness of the semiconductor package.

According to example embodiments, between the chips directly coupled to each other, an upper chip located in a relatively high position may include a recessed side portion. The upper chip having the recessed side portion may significantly reduce or prevent defects occurring in a process of forming the semiconductor package including a lower chip and an upper chip directly contacting each other.

While example embodiments have been shown and described above, it will be apparent to those skilled in the art that modifications and variations could be made without departing from the scope of the present disclosure as defined by the appended claims.

What is claimed is:

1. A method of forming a semiconductor package comprising:
    forming an upper chip;
    forming a lower structure; and
    bonding the upper chip to the lower structure,
    wherein the forming the upper chip comprises:
        forming a semiconductor wafer including upper chip regions;
        forming a groove in the semiconductor wafer between the upper chip regions; and
        cutting the semiconductor wafer along a center portion of the groove,
    wherein the upper chip comprises a lower insulating layer and a lower pad,
    wherein the lower structure comprises an upper insulating layer and an upper pad,
    wherein the lower insulating layer is in direct contact with and coupled to the upper insulating layer, and
    wherein the lower pad is in direct contact with and coupled to the upper pad.

2. The method of claim 1, wherein a lateral side of the upper chip extends between an upper side and a lower side of the upper chip, and comprises a recessed portion.

3. The method of claim 2, wherein the lateral side of the upper chip further comprises a first portion extending from the upper side to the recessed portion in a first direction that is substantially perpendicular to the upper side, and
    wherein the recessed portion extends from the lower side to the first portion.

4. The method of claim 3, wherein the recessed portion comprises a vertical portion and a curved portion,
    wherein the vertical portion extends from the lower side in a second direction that is substantially perpendicular to the lower side, and
    wherein the curved portion extends from the vertical portion to the first portion.

5. The method of claim 2, wherein the upper chip further comprises a semiconductor body and a semiconductor internal circuit region interposed between the semiconductor body and both of the lower insulating layer and the lower pad.

6. The method of claim 5, wherein the semiconductor internal circuit region is narrower than the upper side of the upper chip.

7. The method of claim 1, wherein the lower structure is wider than the upper chip.

8. The method of claim 1, wherein the lower structure further comprises a lower body and a lower internal circuit region interposed between the lower body and both of the upper insulating layer and the upper pad.

9. The method of claim 1, wherein the lower structure further comprises a lower body and a penetrating electrode, and
    wherein the penetrating electrode is electrically connected to the upper pad and penetrates through the lower body.

10. The method of claim 9, wherein the lower body comprises a silicon substrate.

11. A method of forming a semiconductor package comprising:
- forming a semiconductor wafer including upper chip regions spaced apart from each other;
- forming a lower wafer including lower regions;
- forming a groove in the semiconductor wafer between the upper chip regions;
- forming upper chips by cutting the semiconductor wafer along a center portion of the groove;
- forming a structure by bonding the upper chips to the lower regions of the lower wafer; and
- after the forming the structure, forming lower chips by cutting the lower wafer between the lower regions,
- wherein each of the upper chips comprises a lower insulating layer and a lower pad,
- wherein each of the lower chips comprises an upper insulating layer and an upper pad, and
- wherein the lower pad is in direct contact with and coupled to the upper pad.

12. The method of claim 11, wherein the lower insulating layer is in direct contact with and coupled to the upper insulating layer.

13. The method of claim 11, wherein a lateral side of each of the upper chips extends between an upper side and a lower side of each of the upper chips and comprises a recessed portion.

14. The method of claim 13, wherein the lateral side of each of the upper chips further comprises a first portion extending from the upper side to the recessed portion in a first direction that is substantially perpendicular to the upper side, and
- wherein the recessed portion extends from the lower side to the first portion.

15. The method of claim 14, wherein the recessed portion comprises a vertical portion and a curved portion,
- wherein the vertical portion extends from the lower side in a second direction that is substantially perpendicular to the lower side, and
- wherein the curved portion extends from the vertical portion to the first portion.

16. The method of claim 13, wherein each of the upper chips further comprises a semiconductor body and a semiconductor internal circuit region interposed between the semiconductor body and both of the lower insulating layer and the lower pad.

17. The method of claim 11, further comprising:
- after the forming the structure, forming a molding layer on the lower wafer,
- wherein the molding layer is cut while the lower wafer is cut, and
- wherein the molding layer covers a lateral side of each of the upper chips.

18. A method of forming a semiconductor package comprising:
- forming a semiconductor chip comprising a lower insulating layer and a lower pad;
- forming a lower structure comprising an upper insulating layer and an upper pad; and
- bonding the semiconductor chip to the lower structure,
- wherein the lower insulating layer of the semiconductor chip is in direct contact with and coupled to the upper insulating layer of the lower structure, and
- wherein a lateral side of the semiconductor chip extends between an upper side and a lower side of the semiconductor chip and comprises a recessed portion.

19. The method of claim 18, wherein the lower pad of the semiconductor chip is in contact with and coupled to the upper pad of the lower structure.

20. The method of claim 18, wherein the bonding the semiconductor chip to the lower structure comprises:
- positioning the semiconductor chip on the lower structure; and
- applying pressure to the semiconductor chip in a temperature atmosphere higher than room temperature.

* * * * *